US008275050B2

(12) United States Patent
He et al.

(10) Patent No.: US 8,275,050 B2
(45) Date of Patent: Sep. 25, 2012

(54) LOW DENSITY PARITY CHECK (LDPC) ENCODED HIGHER ORDER MODULATION

(75) Inventors: Lin He, Irvine, CA (US); Thomas J. Kolze, Phoenix, AZ (US); Ba-Zhong Shen, Irvine, CA (US); Gottfried Ungerboeck, Langnau a.A. (CH); Bruce J. Currivan, Dove Canyon, CA (US)

(73) Assignee: Broadcom Corporation, Irvine, CA (US)

( * ) Notice: Subject to any disclaimer, the term of this patent is extended or adjusted under 35 U.S.C. 154(b) by 850 days.

(21) Appl. No.: 12/272,556

(22) Filed: Nov. 17, 2008

(65) Prior Publication Data

US 2009/0129484 A1 May 21, 2009

Related U.S. Application Data

(60) Provisional application No. 60/988,644, filed on Nov. 16, 2007.

(51) Int. Cl.
H04N 7/12 (2006.01)
H04N 11/02 (2006.01)
(52) U.S. Cl. .................................. 375/240.26
(58) Field of Classification Search ............. 375/240.26
See application file for complete search history.

(56) References Cited

U.S. PATENT DOCUMENTS

| 7,461,325 B2 * | 12/2008 | Eroz et al. .................. 714/758 |
| 2002/0136317 A1 | 9/2002 | Oelcer et al. |
| 2005/0111565 A1 | 5/2005 | Pons et al. |
| 2006/0045197 A1 | 3/2006 | Ungerboeck et al. |
| 2007/0118787 A1 * | 5/2007 | Schmidt .................. 714/752 |

FOREIGN PATENT DOCUMENTS

EP 1 835 683 A 9/2007

OTHER PUBLICATIONS

Ungerboeck, Gottfried, "Channel Coding with Multilevel / Phase Signals", IEEE Transactions on Information Theory, vol. IT-28, No. 1, Jan. 1982, pp. 55-67.
International Preliminary Report on Patentability and Written Opinion of the International Searching Authority issued in International Patent Application No. PCT/US2008/012845, mailed on May 27, 2010.
Search Report, completion date Jun. 23 2009, for PCT Application No. PCT/US2008/012845, 9 pages.
Digital Video Broadcasting (DVB); Second generation framing structure, channel coding and modulation systems for Broadcasting, Interactive Services, News Gathering and other broadband satellite applications, ETSI EN 302 307 v1.1.2 (Jun. 2006) European Telecommunications Standards Institute, European Broadcasting Union, 2006.

* cited by examiner

*Primary Examiner* — Anh-Vu Ly
*Assistant Examiner* — Maharishi Khirodhar
(74) *Attorney, Agent, or Firm* — Sterne, Kessler, Goldstein & Fox P.L.L.C.

(57) ABSTRACT

A method and apparatus is disclosed to map a sequence of data to Quadrature Amplitude Modulation (QAM) constellation symbols. The method and apparatus encodes only a portion of the sequence of data and leaves a remaining portion of the sequence of data unencoded. The encoded portion of the sequence of data and the remaining unencoded portion of the sequence of data are then mapped into modulation symbols of the QAM constellation. The encoded portion of the sequence of data selects subsets of the QAM constellation, and the remaining unencoded portion of the sequence of data determines a specific modulation symbol within each subset of the QAM constellation.

24 Claims, 7 Drawing Sheets

FIG. 4

Examples:
256-QAM: 6 coded LSBs, 2 uncoded MSBs, 2x2 sets
1024-QAM: 6 coded LSBs, 4 uncoded MSBs, 4x4 sets
4096-QAM: 6 coded LSBs, 6 uncoded MSBs, 8x8 sets

LOW DENSITY PARITY CHECK (LDPC) ENCODED HIGHER ORDER MODULATION

CROSS-REFERENCE TO RELATED APPLICATIONS

The present application claims the benefit of U.S. Provisional Patent Appl. No. 60/988,644, filed Nov. 16, 2007, entitled "Low Density Parity Check Mapping," which is incorporated by reference herein in its entirety.

BACKGROUND OF THE INVENTION

1. Field of the Invention

The present invention is generally related to communication systems. More particularly, the present invention is related to mapping a sequence of data to a Quadrature Amplitude Modulation (QAM) constellation.

2. Related Art

Quadrature amplitude modulation (QAM) is a digital modulation scheme that conveys data by modulating the amplitude and phase of a sinusoidal carrier signal. A constellation diagram depicts the employed set of discrete modulation values in the complex (or Argand) plane, in which typically the x-axis represents real parts and the y-axis represents imaginary parts. The points of the constellation diagram are usually referred to as the modulation symbols that comprise the modulation alphabet. In a QAM scheme, the constellation points are often arranged in a square grid with equal vertical and horizontal spacing, although other configurations are possible. The number of points on the constellation diagram for a QAM scheme is usually a power of two, such as two, four, or eight, to provide some examples. Some of the most common number of points on the constellation diagram are sixteen points representing a 16-QAM, sixty four points representing a 64-QAM, one hundred twenty eight points representing a 128-QAM, and two hundred fifty six points representing a 256-QAM. By moving to a higher-order constellation, such as 1024-QAM to provide an example, more bits per symbol can be transmitted. However, for a given average energy per symbol the constellation points in a higher-order constellation must be closer together. This makes discrimination between the modulation symbols more susceptible to noise and other signal corruptions, and thus can result in a higher error rate.

Commonly, the reliability of symbol detection in the receiver can be increased by restricting the permitted sequence of QAM symbols by an error correction code. In this case, an encoder adds redundancies to the sequence of bits, which are then mapped into QAM symbols. A receiver can then exploit the redundancies to improve the correct determination of the transmitted sequence of modulation symbols. Among various error-correction codes, low density parity check (LDPC) codes are particularly well suited for achieving performance very close to the capacity of a given communication channel. However, very long LDPC codes requiring complex encoders and decoders are needed to obtain good results for higher-order QAM, if all constellation bits are encoded.

Thus, there is a need for an apparatus and/or a method to encode data into higher-order QAM symbols by a LDPC code that overcomes the shortcomings described above. Further aspects and advantages of the present invention will become apparent from the detailed description that follows.

BRIEF DESCRIPTION OF THE DRAWINGS/FIGURES

The accompanying drawings illustrate the present invention and, together with the description, further serve to explain the principles of the present invention and to enable one skilled in the pertinent art to make and use the present invention.

FIG. 4 illustrates a 256-Quadrature Amplitude Modulation (QAM) constellation according to an exemplary embodiment of the present invention.

Figure 1:
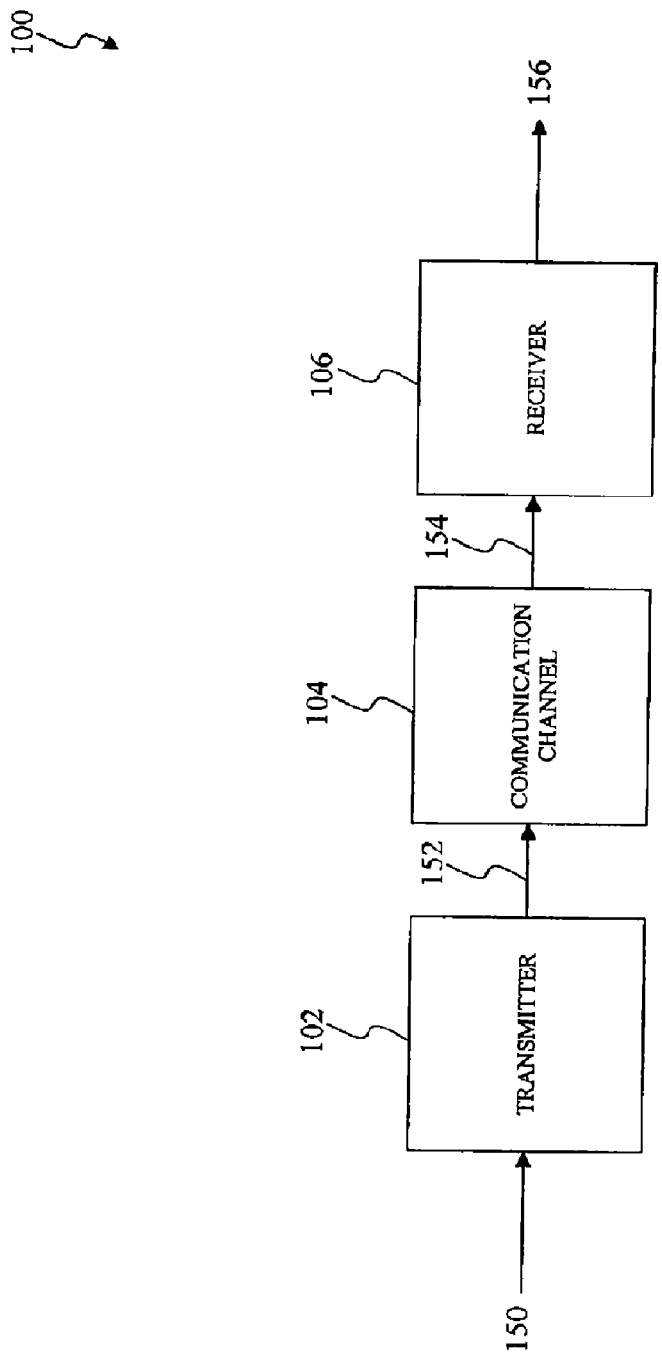
FIG. 1 illustrates a block diagram of a communications environment according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

Overview

The present invention relates to mapping a sequence of data to Quadrature Amplitude Modulation (QAM) constellation symbols by encoding only a portion of the sequence of data and leaving a remaining portion of the sequence of data unencoded. The encoded portion of the sequence of data and the remaining unencoded portion of the sequence of data are then mapped into modulation symbols of the QAM constellation. The encoded portion of the sequence of data selects subsets of the QAM constellation, and the remaining unencoded portion of the sequence of data determines specific modulation symbols within the selected subsets of the QAM constellation.

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present invention. Therefore, the Detailed Description is not meant to limit the present invention. Rather, the scope of the present invention is defined only in accordance with the following claims and their equivalents.

The following Detailed Description of the exemplary embodiments will so fully reveal the general nature of the present invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Communications Environment

FIG. 1 illustrates a block diagram of a communications environment according to an exemplary embodiment of the present invention. The communications environment 100 includes a communications transmitter 102 to transmit a sequence of data 150 as received from one or more communications transmitter user devices to a communications receiver 106 via a communications channel 104. The one or more communications transmitter user devices may include, but are not limited to, personal computers, data terminal equipment, telephony devices, broadband media players, personal digital assistants, software applications, or any other device capable of transmitting or receiving data. The communications transmitter 102 provides a transmitted signal 152 based on the sequence of data 150.

The transmitted signal 152 passes through the communications channel 104 to provide a received signal 154. The communications channel 104 may include, but is not limited to, a microwave radio link, a satellite channel, a fiber optic cable, a hybrid fiber optic cable system, or a copper cable to provide some examples. The communications channel 104 contains a propagation medium that the transmitted signal 152 passes through before reception by the communications receiver 106. The propagation medium of the communications channel 104 may introduce interference and/or distortion into the transmitted signal 152 causing the received signal 154 to differ significantly from the transmitted signal 152. For example, noise such as, but not limited to, thermal noise, burst noise, impulse noise, interference, signal strength variations known as fading, phase shift variations, to provide some examples, may introduce the interference and/or the distortion into the transmitted signal 152.

The communications receiver 106 observes the received signal 154 as it passes through the communications channel 104. The communications receiver 106 determines a most-likely transmitted sequence of modulation symbols of the transmitted signal 152 and data bits encoded therein to provide a sequence of recovered data 156. The sequence of recovered data 156 is provided to one or more receiver user devices such as, but not limited to, personal computers, data terminal equipment, telephony devices, broadband media players, personal digital assistants, software applications, or any other device capable of transmitting or receiving data.

Communications Transmitter

Figure 2:
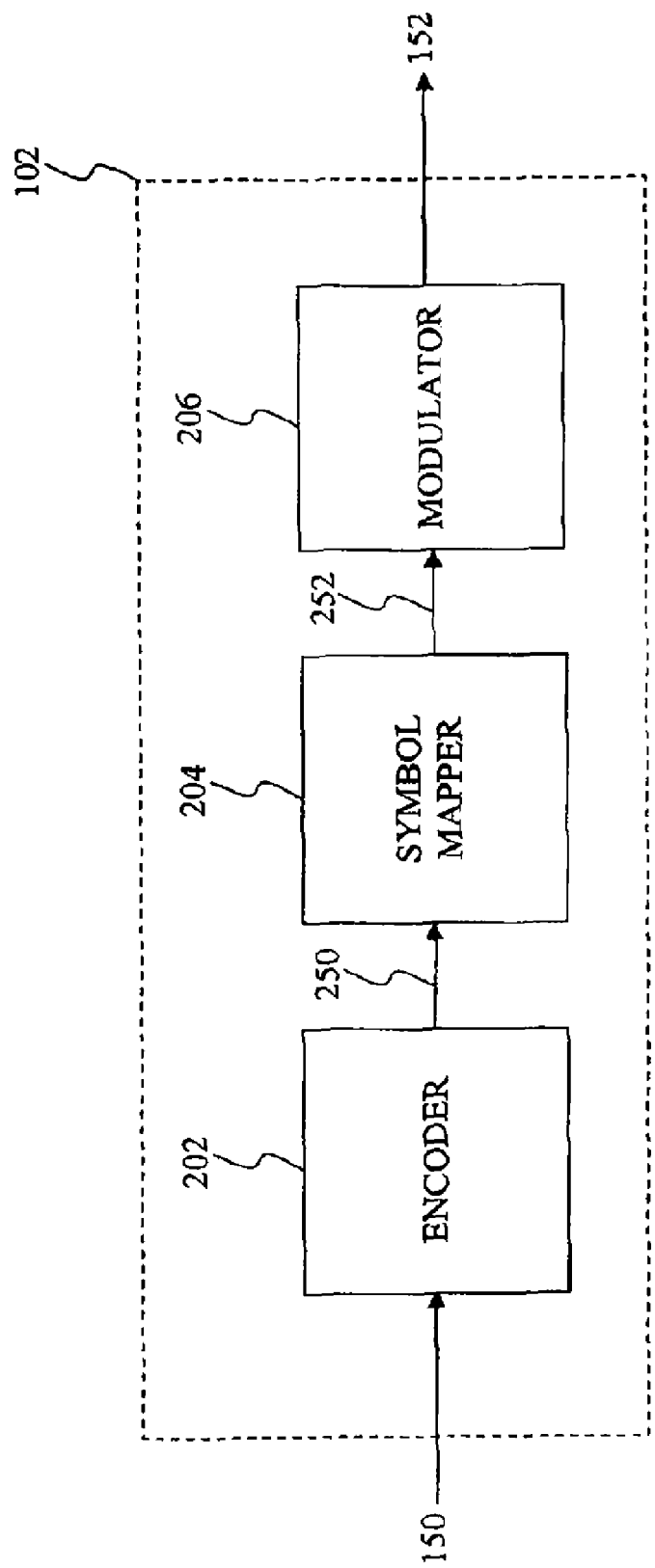
FIG. 2 illustrates a block diagram of a communications transmitter used in the communications environment according to an exemplary embodiment of the present invention.

FIG. 2 illustrates a block diagram of a communications transmitter used in the communications environment according to an exemplary embodiment of the present invention. The communications transmitter 102 includes a communications encoder 202, a symbol mapper 204, and a modulator 206. The communications encoder 202 provides a sequence of encoded data 250 based upon the sequence of data 150.

The sequence of encoded data 250 is segmented into N-bit patterns referred to as symbol labels. The symbol mapper 204 assigns to each symbol label a corresponding modulation symbol from an $2^N$-QAM constellation in accordance with a specific mapping scheme to provide a sequence of modulated data 252. In an exemplary embodiment, the symbol mapper 204 maps four-bit symbol labels into their corresponding symbols from a 16-QAM constellation. In another, the symbol mapper 204 maps five-bit symbol labels into their corresponding symbols from a 32-QAM constellation. In a further exemplary embodiment, the symbol mapper 204 maps six-bit symbol labels into their corresponding symbols from a 32-QAM constellation. However, these examples are not limiting; those skilled in the relevant art(s) may segment the sequence of encoded data 250 into symbol labels of different length.

The symbol mapper 204 may map the symbol labels into their corresponding symbols according to a Gray mapping scheme. An exemplary embodiment of the Gray mapping scheme for the 16-QAM modulation is shown below:

| Gray mapping scheme for the 16-QAM modulation | | | |
|---|---|---|---|
| A ↔ 0000 | B ↔ 0100 | C ↔ 1100 | D ↔ 1000 |
| E ↔ 0001 | F ↔ 0101 | G ↔ 1101 | H ↔ 1001 |
| I ↔ 0011 | J ↔ 0111 | K ↔ 1111 | L ↔ 1011 |
| M ↔ 0010 | N ↔ 0110 | O ↔ 1110 | P ↔ 1010 |

As shown in the table above, the Gray mapping scheme for the 16-QAM modulation may map each of the four-bit symbol labels into their corresponding symbols from the 16-QAM constellation. For example, a symbol label 0000 may be mapped to a first symbol A by the symbol mapper 204. Likewise, a symbol label 0001 may be mapped to a second symbol E by the symbol mapper 204. Similarly, a symbol label 1010 may be mapped to a sixteenth symbol P by the symbol mapper 204.

The modulator 206 modulates a carrier frequency with the sequence of modulated data 252 to provide the transmitted signal 152. The modulator 206 modulates the carrier frequency with the sequence of modulated data 252 to transfer the sequence of modulated data 252 over the communications channel 104 via the transmitted signal 152. In an exemplary embodiment, the modulator 206 is optional; the communications transmitter 102 may directly transmit the sequence of modulated data 252 as the transmitted signal 152.

Communications Encoder

Figure 3A:
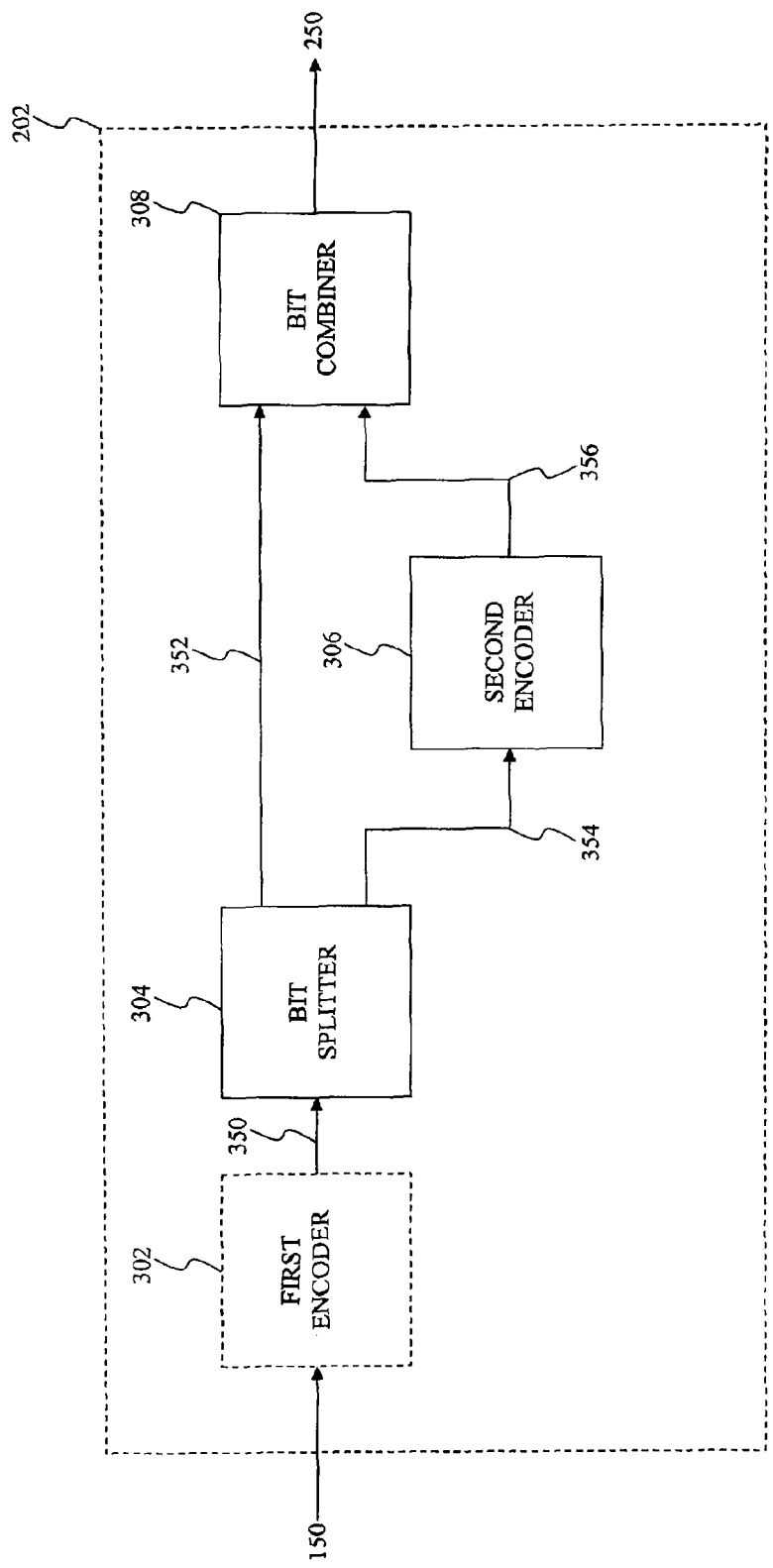
FIG. 3A illustrates a block diagram of a communications encoder used in the communications transmitter according to an exemplary embodiment of the present invention.

FIG. 3A illustrates a block diagram of a communications encoder used in the communications transmitter according to an exemplary embodiment of the present invention. The communications encoder 202 includes a first encoding module 302, a bit splitter module 304, a second encoding module 306, and a bit combiner module 308. The first encoding module 302 provides a sequence of encoded data 350 based upon the sequence of data 150. The first encoding module 302 encodes the sequence of data 150 to provide the sequence of encoded data 350 using one or more encoding algorithms. The sequence of encoded data 350 may include a length of p bits, where p includes one or more parity bits.

The one or more encoding algorithms may include an outer encoding algorithm to provide the one or more parity bits and/or an inner encoding algorithm to provide the one or more parity bits. For example, the first encoding module 302 may encode the sequence of data 150 using an outer encoding algorithm, such as the Bose-Chaudhuri-Hocquenghem (BCH) code or the well known Reed Solomon code to provide some examples, and/or an inner encoding algorithm, such as the Digital Video Broadcasting-Satellite-Second Generation Low Density Parity Check (DVB-S2 LDPC) code to provide an example. The BCH Code and the DVB-S2 LDPC code are further described in the Digital Video Broadcasting (DVB); Second generation framing structure, channel coding and modulation systems for Broadcasting, Interactive Services, News Gathering and other broadband satellite applications, ESTI Reference No. ETSI EN 302 307 V1.1.2 (2006-06), which is incorporated by reference herein in its entirety. However, these example are not limiting, those skilled the relevant art(s) may implement any other suitable outer encoding algorithm and/or inner encoding algorithm differently in accordance with the teachings herein without departing from the spirit and scope of the present invention. Alternatively, the first encoding module 302 may encode the sequence of data 150 using only the outer encoding algorithm. In an exemplary embodiment, the first encoding module 302 is optional; the bit splitter module 304 may directly receive the sequence of data 150.

The bit splitter module 304 provides a sequence of unencoded data 352 and a sequence of pre-encoded data 354 based upon the sequence of data 150 or the sequence of encoded data 350. The bit splitter module 304 parses or separates the sequence of data 150 or the sequence of encoded data 350 into the sequence of unencoded data 352 and the sequence of pre-encoded data 354. The sequence of unencoded data may include a length of m bits and the sequence of pre-encoded data 354 may include a length of p−m bits. In other words, the bit splitter module 304 separates the sequence of data 150 or the sequence of encoded data 350 into a first bit portion of m bits representing the sequence of unencoded data 352 and a second bit portion of p−m bits representing the sequence of pre-encoded data 354. For example, the sequence of data 150 or the sequence of encoded data 350 may include a sequence of 122,992 bits. In this example, the sequence of unencoded data 352 may include a sequence of 64,800 bits and the pre-encoded block of information 350 may include a sequence of 58,192 bits. As another example, the sequence of data 150 or the sequence of encoded data 350 may include a sequence of 30,432 bits. In this example, the sequence of unencoded data 352 may include a sequence of 16,200 bits and the pre-encoded block of information 350 may include a sequence of 14,232 bits.

The second encoding module 306 provides a sequence of encoded data 356 based upon the sequence of pre-encoded data 354. The second encoding module 306 encodes the sequence of pre-encoded data 354 to provide the sequence of encoded data 356 using one or more encoding algorithms. The sequence of encoded data 356 may include a length of p−m+r bits, where r represents one or more parity bits created by the second encoding module 306. The second encoding module 306 may represent a systematic encoder, and/or a non-systematic encoder. For example, the second encoding module 306, when implemented as the systematic encoder, provides the sequence of encoded data 356 including the sequence of pre-encoded data 354 and r additional parity bits. Alternately, the second encoding module 306, when implemented as the non-systematic encoder, provides the sequence of encoded data 356 that does not include the p−m bits of the sequence of pre-encoded data 354. Rather, the non-systematic encoder provides a set of bits that is not embedded with the sequence of pre-encoded data 354. When implemented as either the systematic encoder or the non-systematic encoder, the second encoding module 306 encodes the p−m bits of the sequence of pre-encoded data 354 to provide p−m+r bits representing the sequence of encoded data 356. For example, the second encoding module 306 may encode sequence of 58,192 bits representing the sequence of pre-encoded data 354 to provide of sequence of 64,800 bits representing the sequence of encoded data 356. As another example, the second encoding module 306 may encode sequence of 14,232 bits representing the sequence of pre-encoded data 354 to provide sequence of 16,200 bits representing the sequence of encoded data 356. The second encoding module 306 is described in further detail below.

The bit combiner module 308 provides the sequence of encoded data 250 based upon the sequence of unencoded data 352 and the sequence of encoded data 356. The bit combiner module 308 combines the sequence of unencoded data 352 and the sequence of encoded data 356 to provide the sequence of encoded data 250. More specifically, the bit combiner module 308 combines a first bit portion of the sequence of unencoded data 352 and a second bit portion of the sequence of encoded data 356 to provide the sequence of encoded data 250.

In an exemplary embodiment, the m unencoded bits are passed in $M_{msb}$ bit increments to the bit combiner module 308. Likewise, the p−m+r encoded bits are passed in $M_{lsb}$ bit increments to the bit combiner module 308. For example, the bit combiner module 308 may provide the sequence of encoded data 250 at a rate of eight bits per symbol by receiving a sequence of four-bit increments from the sequence of unencoded data 352 and a sequence of four-bit increments from the sequence of encoded data 356. In this example, the bit combiner module 308 combines the four-bit increments of the sequence of unencoded data 352 and the four-bit increments of the sequence of encoded data 356 such that the sequence of encoded data 250 corresponds to modulation symbols of a 256-QAM constellation. Alternatively, the bit combiner module 308 may provide the sequence of encoded data 250 at the rate of eight bits per symbol by receiving a sequence of two-bit increments from the sequence of unencoded data 352 and a sequence of six-bit increments from the sequence of encoded data 356. In this example, the bit combiner module 308 combines the two-bit increments of the sequence of unencoded data 352 and the six-bit increments of the sequence of encoded data 356 such that the sequence of encoded data 250 corresponds to modulation symbols of the 256-QAM constellation.

As another example, the bit combiner module 308 may provide the sequence of encoded data 250 at the rate of ten bits per symbol by receiving a sequence of four-bit increments from the sequence of unencoded data 352 and a sequence of six-bit increments from the sequence of encoded data 356. In this example, the bit combiner module 308 combines the four-bit increments of the sequence of unencoded data 352 and the six-bit increments of the sequence of encoded data 356 such that the sequence of encoded data 250 corresponds to modulation symbols of a 1024-QAM constellation.

As a further example, the bit combiner module 308 may provide the sequence of encoded data 250 at the rate of twelve bits per symbol by receiving a sequence of six-bit increments from the sequence of unencoded data 352 and a sequence of six-bit increments from the sequence of encoded data 356. In this example, the bit combiner module 308 combines the six-bit increments of the sequence of unencoded data 352 and the six-bit increments of the sequence of encoded data 356 such that the sequence of encoded data 250 corresponds to modulation symbols of a 4096-QAM constellation.

Encoding Module

Figure 3B:
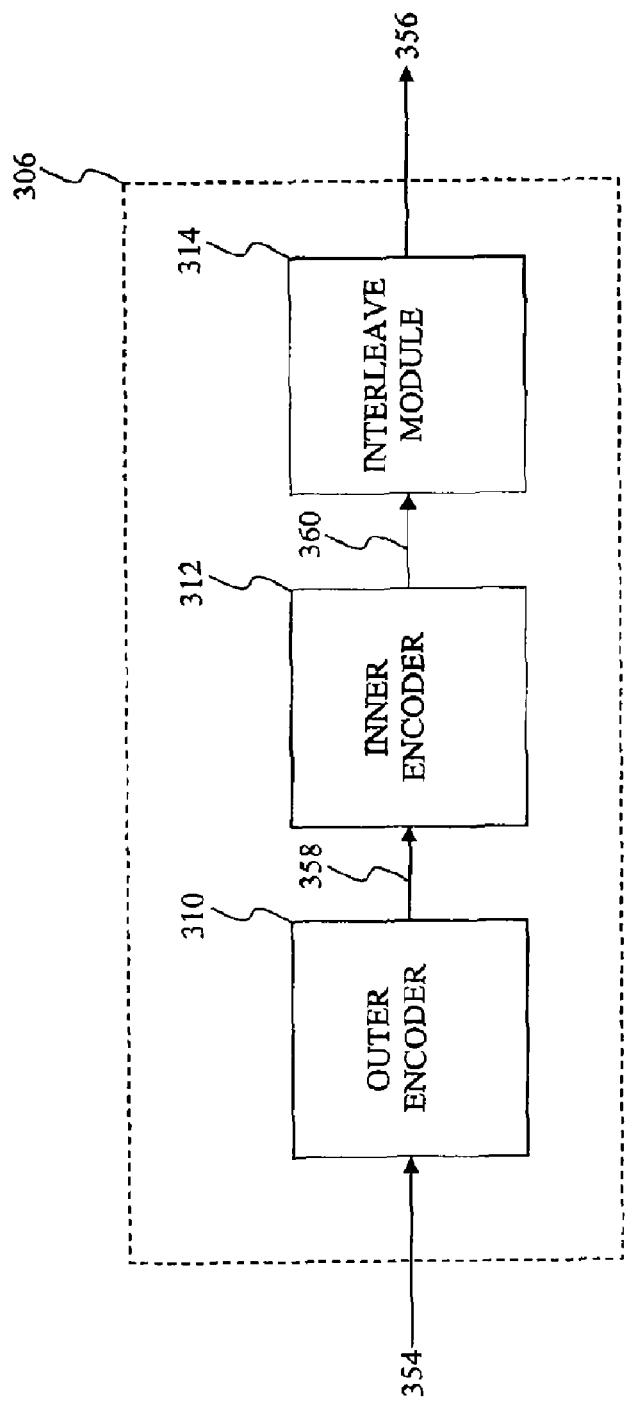
FIG. 3B illustrates an example block diagram of an encoding module according to an exemplary embodiment of the present invention.

FIG. 3B illustrates an example block diagram of the encoding module 306 according to an exemplary embodiment of the present invention. As discussed above, the second encoding module 306 encodes the sequence of pre-encoded data 354 to provide the sequence of encoded data 356 using the one or more encoding algorithms. The second encoding module 306 includes an outer encoding module 310, an inner encoding module 312, and an interleave module 314. The sequence of encoded data 356 may include a length of p–m+r bits, where r may include one or more parity bits, $r_o$, provided by an outer encoding algorithm and/or one or more parity bits, $r_i$, provided by an inner encoding algorithm.

The outer encoding module 310 encodes the sequence of pre-encoded data 354 to provide a sequence of outer encoded data 358 using a first encoding algorithm. The sequence of outer encoded data 358 may include a length of p–m+$r_o$ bits, where $r_o$ represents one or more parity bits provided by the outer encoding module 310. In an exemplary embodiment, the outer encoding module 310 encodes the sequence of pre-encoded data 354 according to the BCH code. However, this example is not limiting, those skilled the relevant art(s) may implement any other suitable encoding algorithm differently in accordance with the teachings herein without departing from the spirit and scope of the present invention. For example, the outer encoding module 310 may encode the sequence of 58,192 bits representing the sequence of pre-encoded data 354 to provide the sequence of outer encoded data 358 including the sequence of 58,320 bits using the BCH code. In this example, the outer encoding module 310 creates a sequence of 128 parity bits for the sequence of outer encoded data 358. As another example, the outer encoding module 310 may encode the sequence of 14,232 bits representing the sequence of pre-encoded data 354 to provide the sequence of outer encoded data 358 including the sequence of 14,400 bits using the BCH code. In this example, the outer encoding module 310 creates 168 parity bits for the sequence of outer encoded data 358.

The inner encoding module 312 encodes the sequence of outer encoded data 358 to provide a sequence of inner encoded data 360 using a second encoding algorithm. The sequence of inner encoded data 360 may include including a length of p–m+$r_o$+$r_i$ bits, where $r_i$ represents one or more parity bits provided by the inner encoding module 312. In an exemplary embodiment, the inner encoding module 312 encodes the sequence of outer encoded data 358 according to the DVB-S2 LDPC code. However, this example is not limiting, those skilled the relevant art(s) may implement any other suitable encoding algorithm differently in accordance with the teachings herein without departing from the spirit and scope of the present invention.

For example, the inner encoding module 312 may encode the sequence of 58,320 bits representing the sequence of outer encoded data 358 to provide the sequence of inner encoded data 360 including sequence of 64,800 bits using the DVB-S2 LDPC code. In this example, the inner encoding module 312 creates a sequence of 6,480 parity bits for the sequence of inner encoded data 360. As another example, the inner encoding module 312 may encode the sequence of 14,400 bits representing the sequence of outer encoded data 358 to provide the sequence of inner encoded data 360 including the sequence of 16,200 bits using the DVB-S2 LDPC code. In this example, the inner encoding module 312 creates 1800 parity bits for the sequence of inner encoded data 360.

The interleave module 314 interleaves the sequence of inner encoded data 360 to provide the sequence of encoded data 356. The p–m+r encoded bits are passed in $M_{lsb}$ bit increments by the interleave module 314 via the sequence of encoded data 356 to the bit combiner module 308. The configuration of the interleave module 314 for the 256-QAM, 1024-QAM, and the 4096-QAM is shown below:

| | COLUMNS | ROWS |
|---|---|---|
| 256-QAM<br>4 unencoded bits per symbol<br>4 encoded bits per symbol | 4 | $\dfrac{(p - m + r_o + r_i)}{4}$ |
| 256-QAM<br>2 unencoded bits per symbol<br>6 encoded bits per symbol | 6 | $\dfrac{(p - m + r_o + r_i)}{6}$ |
| 1024-QAM<br>6 unencoded bits per symbol<br>4 encoded bits per symbol | 4 | $\dfrac{(p - m + r_o + r_i)}{4}$ |
| 1024-QAM<br>4 unencoded bits per symbol<br>6 encoded bits per symbol | 6 | $\dfrac{(p - m + r_o + r_i)}{6}$ |
| 4096-QAM<br>8 unencoded bits per symbol<br>4 encoded bits per symbol | 4 | $\dfrac{(p - m + r_o + r_i)}{4}$ |
| 4096-QAM<br>6 unencoded bits per symbol<br>6 encoded bits per symbol | 6 | $\dfrac{(p - m + r_o + r_i)}{6}$ |
| 4096-QAM<br>4 unencoded bits per symbol<br>8 encoded bits per symbol | 8 | $\dfrac{(p - m + r_o + r_i)}{8}$ |

As shown in the table above, the interleave module 314 may write the sequence of inner encoded data 360 column-wise and read the sequence of inner encoded data 360 row-wise to provide the sequence of encoded data 356. For example, the interleave module 314 may write the sequence of inner encoded data 360 into four columns including $$\frac{(p - m + r_o + r_i)}{4}$$

total bits per column. In this example, the interleave module 314 reads the sequence of inner encoded data 360 from $$\frac{(p - m + r_o + r_i)}{4}$$

rows including four-bits per row to provide the sequence of encoded data 356 representing the 256-QAM constellation.

Those skilled in the relevant art(s) will recognize that the second encoding module 306 need not include the outer encoding module 310, the inner encoding module 312, and/or the interleave module 314 without departing from the spirit and scope of the present invention. For example, the second encoding module 306 may include only the inner encoding module 312. In this example, the inner encoding module 312 directly encodes the sequence of pre-encoded data 354 to provide the sequence of encoded data 356.

The DVB-S2 LDPC code is primarily used to encode low density constellations such as Quadrature Phase Shift Keyed (QPSK), 8-Phase Shift Keyed (PSK), 16 Asymmetric Phase Shift Keyed (APSK) and/or 32 APSK constellations to provide some examples. However, the partitioning of the sequence of encoded data 350 into the sequence of unencoded data 352 and the sequence of pre-encoded data 354 followed by recombining the sequence of unencoded data 352 and the sequence of encoded data 356 allows for the use of the DVB-S2 LDPC code for higher density constellations, such as 256-QAM, 1024-QAM, and/or 4096-QAM to provide some examples. In other words, the second encoding module 306 may reuse one or more encoding algorithms engineered to provide low density constellations in providing for higher density constellations.

QAM Constellations

Figure 4:
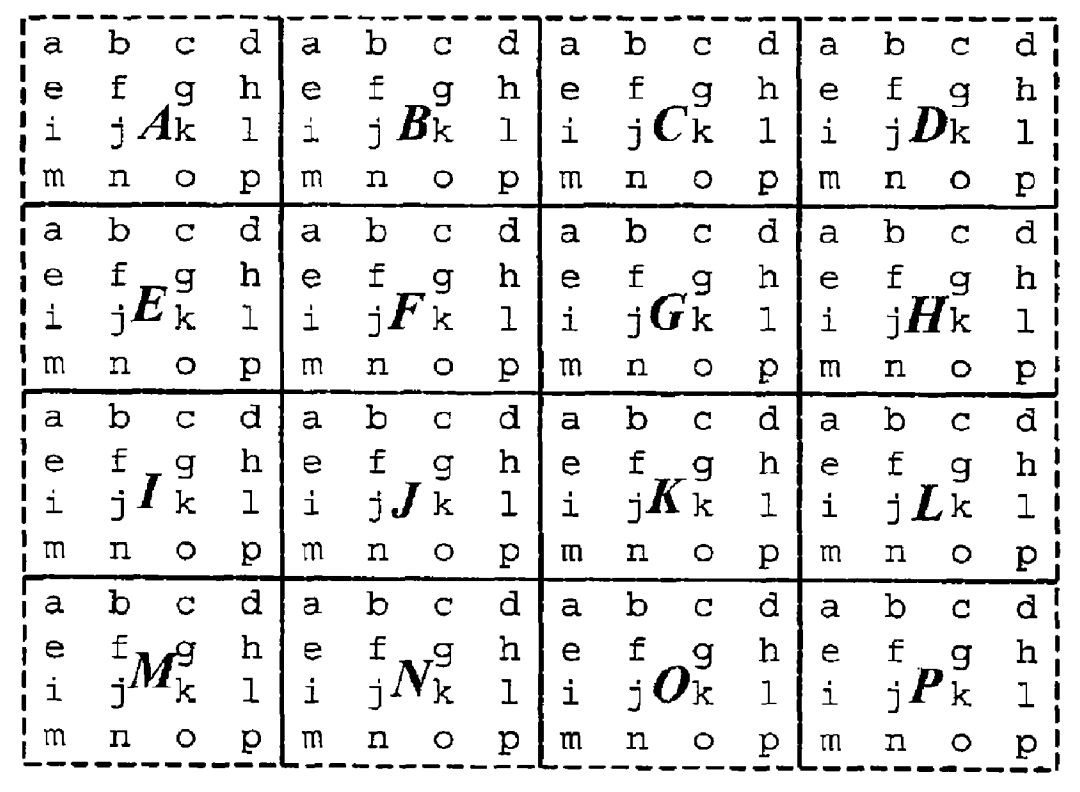

FIG. 4 illustrates a 256-Quadrature Amplitude Modulation (QAM) constellation according to an exemplary embodiment of the present invention. From the discussion above, the sequence of unencoded data 352 may include a sequence of four-bit increments and the sequence of encoded data 356 may include a sequence of four-bit increments. The communications encoder 202 may provide the sequence of encoded data 250 representing one or more of the 256 modulation symbols of the 256-QAM constellation by receiving the sequence of four-bit increments from the sequence of unencoded data 352 and the sequence of four-bit increments from the sequence of encoded data 356.

As shown in FIG. 4, the sequence of four-bit increments from the sequence of unencoded data 352 represent a corresponding one of sixteen subsets of constellation points, denoted as "A" through "P", of the 256-QAM constellation while the sequence of four-bit increments from the sequence of encoded data 356 represent a corresponding one of the sixteen modulation symbols, denoted as "a" through "p", within the corresponding one of the sixteen subsets of constellation points. For example, when the symbol mapper 204 maps the four-bit symbol labels into the 16-QAM modulation symbols according to the Gray mapping scheme, then the constellation point "Ad" represents the symbol label (0000, 1000). Likewise, the constellation point "Mm" represents the symbol label (0010, 0010). Alternatively, the sequence of four-bit increments from the sequence of encoded data 356 represent a corresponding one of sixteen subsets of constellation points, denoted as "a" through "p", of the 256-QAM constellation while the sequence of four-bit increments from the sequence of unencoded data 352 represent a corresponding one of the sixteen modulation symbols, denoted as "A" through "P", within the corresponding one of the sixteen subsets of constellation points.

Although the sixteen subsets of constellation points are not protected by coding, these sixteen subsets of constellation points have a larger minimum Euclidean distance of separation when compared to the sixteen modulation symbols within each of the sixteen subsets of constellation points, due to set partitioning. For example, the constellation point "Am" and the constellation point "Bm" have a larger minimum Euclidean distance of separation when compared to the constellation point "Am" and the constellation point "An". However, the least significant bits of the constellation point "Am", namely "m" and the least significant bits of the constellation point "An", namely "n" are protected by coding.

Figure 5:
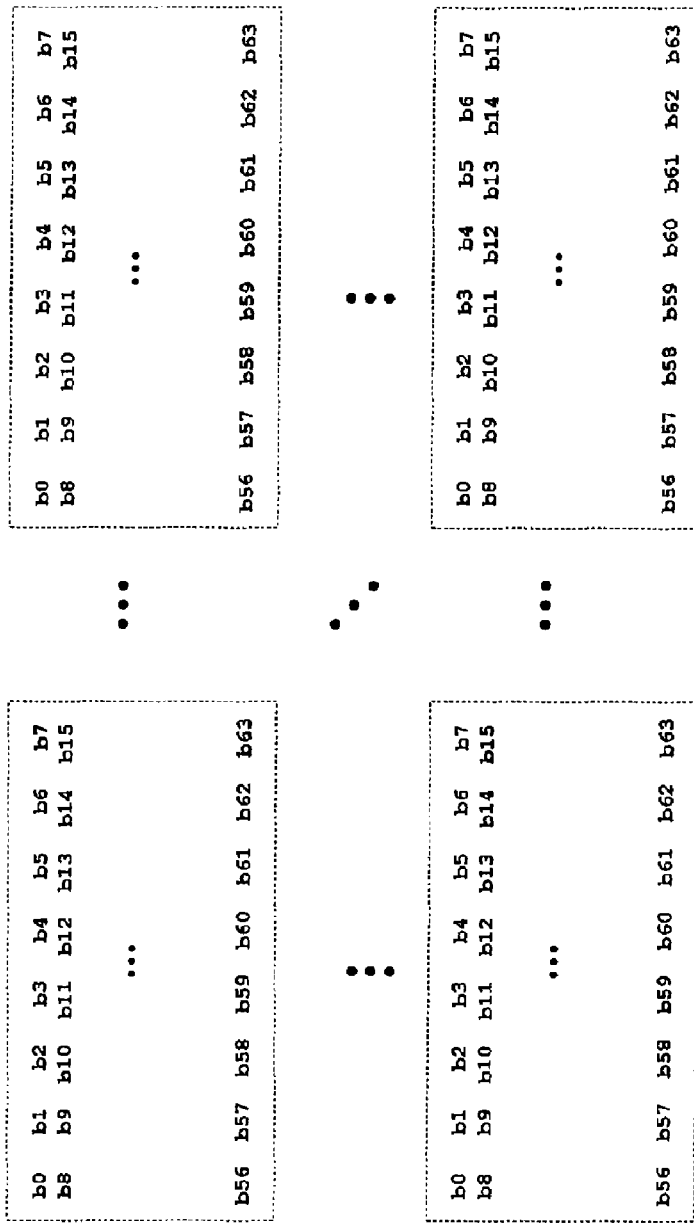
FIG. 5 illustrates another 256-QAM constellation, a 1024-QAM constellation, and a 4096-QAM constellation according to an exemplary embodiment of the present invention.

FIG. 5 illustrates another 256-QAM constellation, a 1024-QAM constellation, and a 4096-QAM constellation according to an exemplary embodiment of the present invention. From the discussion above, the bit combiner module 308 may provide the sequence of encoded data 250 at a rate of eight, ten, or twelve bits per symbol label such that the sequence of encoded data 250 represents one or more of the 256 modulation symbols of the 256-QAM constellation, one or more of the 1024 modulation symbols of the 1024-QAM constellation, or one or more of the 4096 modulation symbols of the 4096-QAM constellation, respectively. The sequence of unencoded data 352 may be provided at a rate of two, four, or six-bit increments and the sequence of encoded data 356 may be provide at a rate of four-bit increments.

As shown in FIG. 5, the sequence of two-bit increments from the sequence of unencoded data 352 represent a corresponding one of four subsets of constellation points of the 256-QAM constellation while the sequence of six-bit increments from the sequence of encoded data 356 represent a corresponding one of the sixty-four modulation symbols, denoted as $b_0$ through $b_{63}$, within the corresponding one of the four subsets of constellation points. Likewise, the sequence of four-bit increments from the sequence of unencoded data 352 represent a corresponding one of sixteen subsets of constellation points of the 1024-QAM constellation while the sequence of six-bit increments from the sequence of encoded data 356 represent a corresponding one of the sixty-four modulation symbols, denoted as $b_0$ through $b_{63}$, within the corresponding one of the sixteen subsets of constellation points. Similarly, the sequence of six-bit increments from the sequence of unencoded data 352 represent a corresponding one of sixty-four subsets of constellation points of the 4096-QAM constellation while the sequence of six-bit increments from the sequence of encoded data 356 represent a corresponding one of the sixty-four modulation symbols, denoted as $b_0$ through $b_{63}$, within the corresponding one of the sixty-four subsets of constellation points.

Operational Control Flow of the Communications Transmitter

Figure 6:
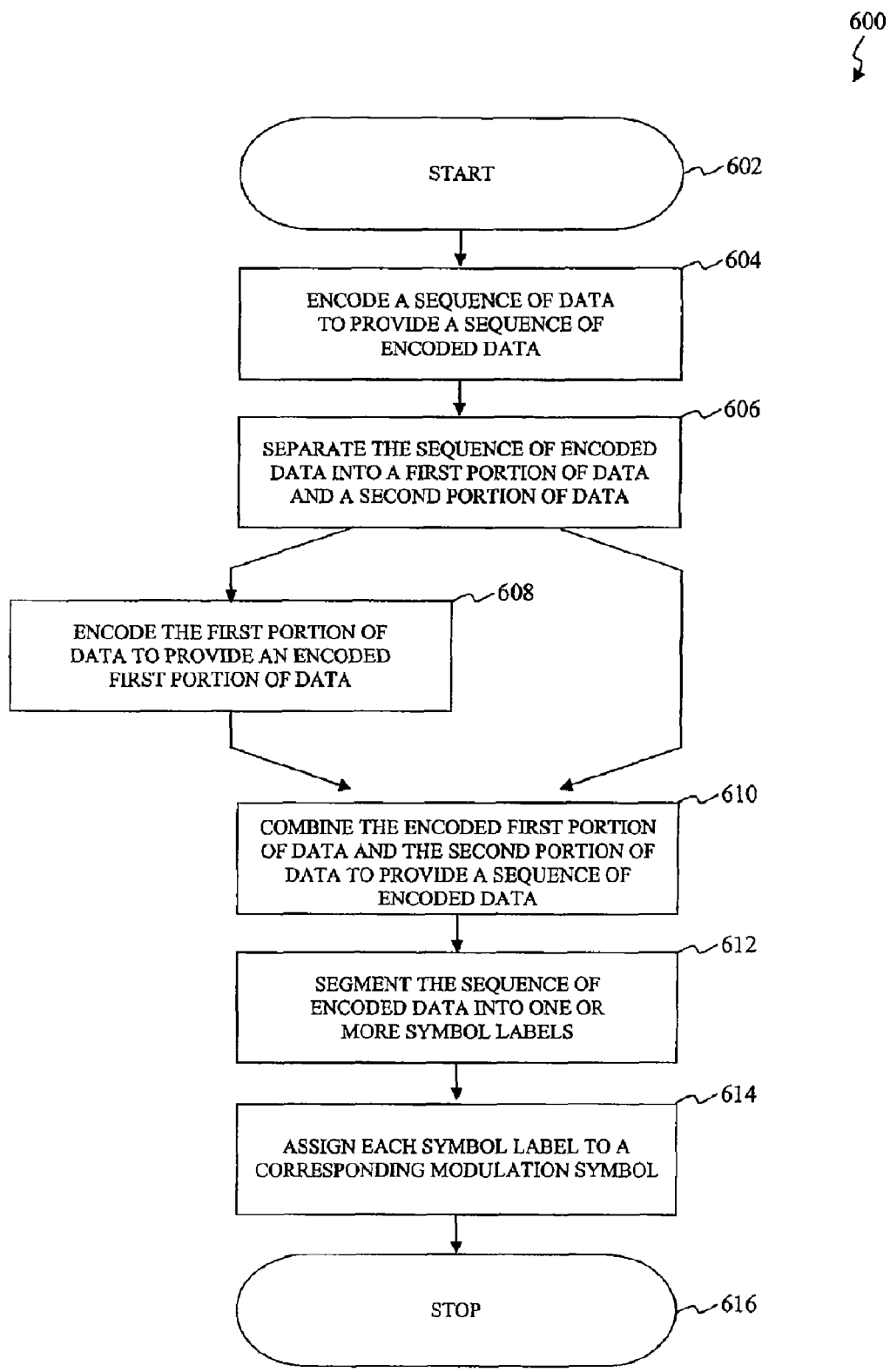
FIG. 6 is a flowchart of exemplary operational steps of the communications transmitter used in the communications environment according to an aspect of the present invention.

FIG. 6 is a flowchart 600 of exemplary operational steps of the communications transmitter used in the communications environment according to an aspect of the present invention. Rather, it will be apparent to persons skilled in the relevant art(s) from the teachings herein that other operational control flows are within the scope and spirit of the present invention. The following discussion describes the steps in FIG. 6.

At step 602, the operational control flow starts. The operational flow control proceeds to step 604.

At step 604, the operational control flow encodes a sequence of data, such as the sequence of data 150 to provide an example, using one or more first encoding algorithms to provide a sequence of encoded data, such as the sequence of encoded data 350 to provide an example. The sequence of encoded data may include a length of p bits, where p includes one or more parity bits. The one or more first encoding algorithms may include an outer encoding algorithm to provide the one or more parity bits and/or an inner encoding algorithm to provide the one or more parity bits.

For example, the operational control flow may encode the sequence of data in its entirety using an outer encoding algorithm, such as the Bose-BCH code or the well known Reed Solomon code to provide some examples, and/or an inner encoding algorithm, such as the DVB-S2 LDPC code to provide an example. Alternatively, the operational control flow may encode the sequence of data in its entirety using only the outer encoding algorithm. In an exemplary embodiment, step 604 is optional; step 606 may directly receive the sequence of data.

At step 606, the operational control flow parses or separates the sequence of encoded data from step 604 or the sequence of data from step 604 into a first portion of data, such as the sequence of pre-encoded data 354 to provide an example, and a second portion, such as the sequence of unencoded data 352 to provide an example. The first portion of data may include a length of p−m bits and the second portion of data may include a length of p bits.

At step 608, the operational control flow encodes the p−m bits of the first portion of data from step 606 to provide an encoded first portion of data, such as the sequence of encoded data 356 to provide an example, of length p−m+$r_o$+$r_i$ bits using one or more second encoding algorithms. The one or more second encoding algorithms may include an outer encoding algorithm to provide the $r_o$ parity bits and/or an inner encoding algorithm to provide the $r_i$ parity bits.

For example, the operational control flow may encode the first portion of data from step 606 in its entirety using an inner encoding algorithm, such as the DVB-S2 LDPC code to provide an example. Alternatively, the operational control flow may encode the first portion of data from step 606 in its entirety using the outer encoding algorithm, such as the Bose-BCH code or the well known Reed Solomon code to provide some examples, and/or the inner encoding algorithm, such as the DVB-S2 LDPC code to provide an example.

The operational control flow may additionally interleave the first portion of data from step 606 after encoding by the inner encoding algorithm and/or the outer encoding algorithm.

At step 610, the operational control flow combines a part of the encoded first portion of data from step 608 and a part of the second portion of data from step 606 to provide a sequence of encoded data, such as the sequence of encoded data 250 to provide an example.

The operational control flow combines $M_{lsb}$ bit increments of the p−m+r encoded bits of the encoded first portion of data from step 608 and $M_{msb}$ bit increments of the m unencoded bits of the second portion of data from step 606 to provide the sequence of encoded data. For example, the operational control flow may provide the sequence of encoded data at a rate of eight bits per symbol by receiving a sequence of four-bit increments from the second portion of data from step 606 and a sequence of four-bit increments from the encoded first portion of data from step 608. In this example, the operational control flow combines the four-bit increments of the second portion of data from step 606 and the four-bit increments of the encoded first portion of data from step 608 such that the sequence of encoded data corresponds to modulation symbols of a 256-QAM constellation. Alternatively, the operational control flow may provide the sequence of encoded data at the rate of eight bits per symbol by receiving a sequence of two-bit increments from the second portion of data from step 606 and a sequence of six-bit increments from the encoded first portion of data from step 608. In this example, the operational control flow combines the two-bit increments of the second portion of data from step 606 and the six-bit increments of the encoded first portion of data from step 608 such that the sequence of encoded data corresponds to modulation symbols of the 256-QAM constellation.

As another example, the operational control flow may provide the sequence of encoded data at the rate of ten bits per symbol by receiving a sequence of four-bit increments from the second portion of data from step 606 and a sequence of six-bit increments from the encoded first portion of data from step 608. In this example, the operational control flow combines the four-bit increments of the second portion of data from step 606 and the six-bit increments of the encoded first portion of data from step 608 such that the sequence of encoded data corresponds to modulation symbols of a 1024-QAM constellation.

As a further example, the operational control flow may provide the sequence of encoded data at the rate of twelve bits per symbol by receiving a sequence of six-bit increments from the second portion of data from step 606 and a sequence of six-bit increments from the encoded first portion of data from step 608. In this example, the operational control flow combines the six-bit increments of the second portion of data from step 606 and the six-bit increments of the encoded first portion of data from step 608 such that the sequence of encoded data corresponds to modulation symbols of a 4096-QAM constellation.

At step 612, the operational control flow segments the sequence of encoded data from step 610 into N-bit patterns referred to as symbol labels. For example, the operational control flow may segment the sequence of encoded data from step 610 into four-bit, five-bit, and/or six-bit patterns.

At step 614, the operational control flow assigns to each symbol label from step 612 a corresponding modulation symbol from an $2^N$-QAM constellation in accordance with a specific mapping scheme to provide a sequence of modulated data, such as the sequence of modulated data 252 to provide an example. In an exemplary embodiment, the symbol mapper 204 maps four-bit symbol labels into their corresponding symbols from a 16-QAM constellation. In another, the operational control flow maps five-bit symbol labels from step 612 into their corresponding symbols from a 32-QAM constellation. In a further exemplary embodiment, the operational control flow maps six-bit symbol labels from step 612 into their corresponding symbols from a 64-QAM constellation. In a yet further exemplary embodiment, the operational control flow may map the symbol labels from step 612 into their corresponding symbols according to the Gray mapping scheme.

At step 616, the operational control flow stops.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present invention. Thus, the present invention should not be limited by any of the above-described exemplary embodiments, but should be defined only in accordance with the following claims and their equivalents.

What is claimed is:

1. A method to map a sequence of data into modulation symbols, comprising:
 (a) separating the sequence of data into a sequence of pre-encoded data and a sequence of unencoded data;
 (b)(i) encoding the sequence of pre-encoded data using a second outer encoding algorithm to provide a sequence of outer encoded data, and (b)(ii) encoding the sequence of outer encoded data using a Low Density Parity Check (LDPC) Code to provide a first sequence of encoded data;
 (c) combining a first bit increment from the sequence of unencoded data and a second bit increment from the first sequence of encoded data to provide a second sequence of encoded data;

(d) segmenting the second sequence of encoded data into a plurality of symbol labels; and (e) assigning to each symbol label from the plurality of symbol labels a corresponding modulation symbol from a Quadrature Amplitude Modulation (QAM) constellation in accordance with a specific mapping scheme, wherein the separating, encoding, combining segmenting and assigning are performed by one or more communication devices.

2. The method of claim 1, prior to step (a), further comprising:

(1) encoding the sequence of data using one or more encoding algorithms.

3. The method of claim 2, wherein step (1) comprises:

(1)(i) encoding the sequence of data using at least one of: a first outer encoding algorithm and a first inner encoding algorithm.

4. The method of claim 2, wherein step (1)(i) comprises:

(1)(i)(A) encoding the sequence of data using at least one of: a Bose-Chaudhuri-Hocquenghem (BCH) code, a Digital Video Broadcasting-Satellite-Second Generation Low Density Parity Check (DVB-S2 LDPC) code, and a Reed Solomon code.

5. The method of claim 1, wherein step (b)(i) comprises:

(b)(i)(A) encoding the sequence of pre-encoded data using a Bose-Chaudhuri-Hocquenghem (BCH) code.

6. The method of claim 1, wherein step (b)(ii) comprises:

(b)(ii) encoding the sequence of outer encoded data using the Low Density Parity Check (LDPC) Code includes using a Digital Video Broadcasting-Satellite-Second Generation Low Density Parity Check (DVB-S2 LDPC) code.

7. The method of claim 1, wherein step (b) further comprises:

(b)(iii) interleaving the sequence of inner encoded data to provide the first sequence of encoded data.

8. The method of claim 1, wherein step (c) comprises:

(c)(i) combining at least one of:

a first four-bit increment from the sequence of unencoded data and a second four-bit increment from the first sequence of encoded data to provide the second sequence of encoded data corresponding to modulation symbols of a first 256-QAM constellation, a two-bit increment from the sequence of unencoded data and a six-bit increment from the first sequence of encoded data to provide the second sequence of encoded data corresponding to modulation symbols of a second 256-QAM constellation, a four-bit increment from the sequence of unencoded data and a six-bit increment from the first sequence of encoded data to provide the second sequence of encoded data corresponding to modulation symbols of a 1024-QAM constellation, and a first six-bit increment from the sequence of unencoded data and a second six-bit increment from the first sequence of encoded data to provide the second sequence of encoded data corresponding to modulation symbols of a 4096-QAM constellation.

9. The method of claim 1, wherein step (d) comprises:

(d)(i) segmenting the second sequence of encoded data into a plurality of bit patterns.

10. The method of claim 1, wherein step (d)(i) comprises:

(d)(i)(A) segmenting the second sequence of encoded data into at least one of: four-bit patterns, five-bit patterns, and six-bit patterns.

11. The method of claim 1, wherein step (e) comprises:

(e)(i) assigning to each symbol label from the plurality of symbol labels a corresponding modulation symbol from at least one of: a 16-QAM constellation, a 32-QAM constellation, and a 64-QAM constellation.

12. The method of claim 1, wherein step (e) comprises:

(e)(i) assigning to each symbol label from the plurality of symbol labels a corresponding modulation symbol from the QAM constellation in accordance with a Gray mapping scheme.

13. An apparatus to map a sequence of data into modulation symbols, comprising:

a bit splitter module configured to separate the sequence of data into a sequence of pre-encoded data and a sequence of unencoded data;

a first encoding module comprising an outer encoding module configured to encode the sequence of pre-encoded data using a second outer encoding algorithm to provide a sequence of outer encoded data, and an inner encoding module configured to encode the sequence of outer encoded data using a LDPC code to provide a first sequence of encoded data;

a bit combiner module configured to combine a first bit increment from the sequence of unencoded data and a second bit increment from the first sequence of encoded data to provide a second sequence of encoded data and to segment the second sequence of encoded data into a plurality of symbol labels; and a symbol mapper configured to assign to each symbol label from the plurality of symbol labels a corresponding modulation symbol from a QAM constellation in accordance with a specific mapping scheme.

14. The apparatus of claim 13, further comprising:

a second encoding module configured to encode the sequence of data using one or more encoding algorithms.

15. The apparatus of claim 14, wherein the one or more encoding algorithms includes at least one of: a first outer encoding algorithm and a first inner encoding algorithm.

16. The apparatus of claim 14, wherein the one or more encoding algorithms includes at least one of: a Bose-Chaudhuri-Hocquenghem (BCH) code, a Digital Video Broadcasting-Satellite-Second Generation Low Density Parity Check (DVB-S2 LDPC) code, and a Reed Solomon code.

17. The apparatus of claim 13, wherein the second outer encoding algorithm includes a Bose-Chaudhuri-Hocquenghem (BCH) code.

18. The apparatus of claim 13, wherein the LDPC Code includes a Digital Video Broadcasting-Satellite-Second Generation Low Density Parity Check (DVB-S2 LDPC) code.

19. The apparatus of claim 13, wherein the first encoding module further comprises:

interleave module configured to interleave the sequence of inner encoded data to provide the first sequence of encoded data.

20. The apparatus of claim 13, wherein the bit combiner module is configured to combine at least one of:

a first four-bit increment from the sequence of unencoded data and a second four-bit increment from the first sequence of encoded data to provide the second sequence of encoded data corresponding to modulation symbols of a first 256-QAM constellation, a two-bit increment from the sequence of unencoded data and a six-bit increment from the first sequence of encoded data to provide the second sequence of encoded data corresponding to modulation symbols of a second 256-QAM constellation, a four-bit increment from the sequence of unencoded data and a six-bit increment from the first sequence of encoded data to provide the second sequence of encoded data corresponding to modulation symbols of a 1024-QAM constellation, and a first six-bit increment from the sequence of unencoded data and a second six-bit increment from the first sequence of encoded data to provide the second sequence of encoded data corresponding to modulation symbols of a 4096-QAM constellation.

21. The apparatus of claim 13, wherein the bit combiner module is configured to segment the second sequence of encoded data into a plurality of bit patterns.

22. The apparatus of claim 13, wherein the bit combiner module is configured to segment the second sequence of encoded data into at least one of: four bit patterns, five-bit patterns, and six-bit patterns.

23. The apparatus of claim 13, wherein the symbol mapper is configured to assign to each symbol label from the plurality of symbol labels a corresponding modulation symbol from at least one of: a 16-QAM constellation, a 32-QAM constellation, and a 64-QAM constellation.

24. The apparatus of claim 13, wherein the symbol mapper is configured to assign to each symbol label from the plurality of symbol labels a corresponding modulation symbol from the QAM constellation in accordance with a Gray mapping scheme.

* * * * *